United States Patent
Swart et al.

(10) Patent No.: US 10,627,427 B2
(45) Date of Patent: Apr. 21, 2020

(54) MANUFACTURING ADVANCED TEST PROBES

(71) Applicant: INTEL CORPORATION, Santa Clara, CA (US)

(72) Inventors: Roy E. Swart, Hillsboro, OR (US); Paul B. Fischer, Portland, OR (US); Charlotte C. Kwong, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 185 days.

(21) Appl. No.: 15/795,099

(22) Filed: Oct. 26, 2017

(65) Prior Publication Data
US 2018/0045760 A1    Feb. 15, 2018

Related U.S. Application Data

(62) Division of application No. 13/977,665, filed as application No. PCT/US2011/068273 on Dec. 31, 2011, now abandoned.

(51) Int. Cl.
| | |
|---|---|
| *G01R 3/00* | (2006.01) |
| *G01R 1/067* | (2006.01) |
| *B23K 26/18* | (2006.01) |
| *B23K 26/38* | (2014.01) |
| *G01R 1/073* | (2006.01) |

(52) U.S. Cl.
CPC .............. *G01R 3/00* (2013.01); *B23K 26/18* (2013.01); *B23K 26/38* (2013.01); *G01R 1/067* (2013.01); *G01R 1/073* (2013.01); *Y10T 29/49156* (2015.01)

(58) Field of Classification Search
CPC .......... G01R 3/00; G01R 1/073; G01R 1/067; B23K 26/38; B23K 26/18; Y10T 29/49156
See application file for complete search history.

(56) References Cited

U.S. PATENT DOCUMENTS

| | | | |
|---|---|---|---|
| 5,001,544 A | 3/1991 | Boucard | |
| 6,121,058 A | 9/2000 | Shell et al. | |
| 6,139,715 A | 10/2000 | Wei | |
| 6,343,369 B1* | 1/2002 | Saunders | G01R 1/06772 324/755.01 |

(Continued)

FOREIGN PATENT DOCUMENTS

| | | |
|---|---|---|
| KR | 10-2004-0044808 | 5/2004 |
| KR | 10-2007-0045348 | 5/2007 |

(Continued)

OTHER PUBLICATIONS

International Search Report and Written Opinion for International Application No. PCT/US2011/068273, dated Sep. 19, 2012, 10 pp. [77.232PCT (ISR & WO)].

(Continued)

*Primary Examiner* — Son T Le
(74) *Attorney, Agent, or Firm* — Konrad Raynes Davda & Victor LLP; Alan S. Raynes

(57) ABSTRACT

Embodiments relate to the formation of test probes. One method includes providing a bulk sheet of an electrically conductive material. A laser is used to cut through the bulk sheet in a predetermined pattern to form a test probe. Other embodiments are described and claimed.

10 Claims, 2 Drawing Sheets

(56) References Cited

U.S. PATENT DOCUMENTS

| | | |
|---|---|---|
| 6,419,500 B1 | 7/2002 | Kister |
| 6,603,297 B1 * | 8/2003 | Gessford ............ G01R 1/06738 324/72.5 |
| 7,323,816 B2 | 1/2008 | Lovell et al. |
| 7,436,193 B2 | 10/2008 | Crippen |
| 7,485,956 B2 | 2/2009 | Tuckerman et al. |
| 7,619,424 B2 | 11/2009 | Hoshino et al. |
| 7,709,294 B2 | 5/2010 | Clare et al. |
| 7,749,813 B2 | 7/2010 | Kolodin et al. |
| 7,869,334 B2 | 1/2011 | Heck |
| 7,887,712 B2 | 2/2011 | Boyle et al. |
| 8,159,256 B2 | 4/2012 | Hoshino et al. |
| 8,237,124 B2 | 8/2012 | Marwala et al. |
| 8,513,966 B2 | 8/2013 | Ma et al. |
| 9,070,739 B2 | 6/2015 | Stone |
| 9,279,830 B2 | 3/2016 | Swart et al. |
| 9,583,729 B2 | 2/2017 | Ingle et al. |
| 2002/0027443 A1 | 3/2002 | Rincon et al. |
| 2003/0001606 A1 | 1/2003 | Bende et al. |
| 2004/0032272 A1 * | 2/2004 | Maruyama ............ G01R 1/0675 324/754.23 |
| 2006/0091110 A1 | 5/2006 | Oh |
| 2007/0007974 A1 | 1/2007 | Chiu et al. |
| 2007/0184629 A1 | 8/2007 | Bogner et al. |
| 2007/0259506 A1 | 11/2007 | Hoshino et al. |
| 2008/0088327 A1 | 4/2008 | Kister |
| 2008/0204062 A1 * | 8/2008 | Tran ................... G01R 1/07342 324/755.07 |
| 2008/0258746 A1 | 10/2008 | Tran et al. |
| 2009/0273357 A1 * | 11/2009 | Kamata ............. G01R 1/06727 324/754.03 |
| 2010/0077597 A1 | 4/2010 | Hoshino et al. |
| 2010/0218899 A1 | 9/2010 | Clare et al. |
| 2011/0006796 A1 | 1/2011 | Kister et al. |
| 2011/0115515 A1 * | 5/2011 | Hirakawa .......... G01R 1/06733 324/755.01 |
| 2012/0074979 A1 | 3/2012 | Lee et al. |
| 2013/0000117 A1 | 1/2013 | Baskaran et al. |
| 2013/0269173 A1 | 10/2013 | Albertson et al. |
| 2014/0210499 A1 | 7/2014 | Crippen et al. |
| 2014/0239995 A1 | 8/2014 | Swart et al. |
| 2015/0008950 A1 | 1/2015 | Swart et al. |
| 2015/0306363 A1 | 10/2015 | Meyer et al. |
| 2016/0195492 A1 | 7/2016 | Bauer |

FOREIGN PATENT DOCUMENTS

| | | |
|---|---|---|
| KR | 10-0872065 | 12/2008 |
| KR | 10-2009-0038610 | 4/2009 |

OTHER PUBLICATIONS

International Preliminary Report on Patentability (IPRP) for International Application No. PCT/US2011/068273, dated Jul. 10, 2014, 7 pp. [77.232PCT (IPRP)].

Preliminary Amendment for U.S. Appl. No. 13/977,665, dated Dec. 1, 2016, 5 pp. [77.232 (PrelimAmend)].

Office Action 1 for U.S. Appl. No. 13/977,665, dated Mar. 21, 2017, 24 pp. [77.232 (OA1)].

Response to Office Action 1 for U.S. Appl. No. 13/977,665, dated Jun. 21, 2017, 7 pp. [77.232 (ROA1)].

Final Office Action for U.S. Appl. No. 13/977,665, dated Jul. 26, 2017, 9 pp. [77.232 (FOA1)].

* cited by examiner

MANUFACTURING ADVANCED TEST PROBES

BACKGROUND

Test probes are typically used to provide an electrical path between a test system and circuits on a wafer or die, thereby permitting the testing and validation of the circuits thereon, before they are packaged. The probes are often long and narrow, and are fit within a probe card that holds the probes in place. Test probes are typically formed from electrically conductive materials that have adequate mechanical properties to survive the repeated uses and elevated temperatures that the probe tip sees when in service. As a result, lower strength metals with low resistivity such as pure gold, silver, and copper are typically not used exclusively as advanced test probe materials.

Test probes are becoming more difficult to manufacture due to the continued scaling of Moore's law for first level interconnect pitch and the complexity of electrical and mechanical requirements for high volume manufacturing testing. Ohmic heating of test probes during large current delivery leads to irreversible deformation under load. As a result, low resistance materials are desirable to minimize the self-heating. Cycling during high volume manufacturing test socketing may lead to early fatigue failures of probes. As a result, high strength materials are sought for the probe. However, materials with both low resistance (high conductivity) and high strength for use as a probe are not common.

Among the types of probes include MEMS (micro-electro-mechanical systems) probes, which can be formed to combine the properties of good electrical conduction (low ohmic heating) and good springs (strong and tough) into a single probe design with composite materials. Such MEMS probes, however, are often complex and expensive to manufacture. Another probe type is a buckling beam type, which is manufactured using drawn wire and a cold-work forming process. Such a process is generally limited to metals that can be easily cold-formed, which often do not provide the sought after conductivity and mechanical properties characteristics for advanced test probes.

Tungsten (W) and its alloys offer good properties for use as a test probe, due to its relatively low resistivity and high mechanical strength. It has been largely unavailable for advanced probes (for example, those with curved structures and tight tolerances) due to manufacturing challenges, as it cannot be plated or deposited using thin film CVD deposition to thicknesses greater than about 2 microns, and the thick sheets (about 50 microns) cannot be etched to form straight sidewalls. Devices with C4 bumps generally require high density array probing and complicated vertical designs with elaborate curves and tight tolerances. Drawn tungsten wire cannot be formed into such complicated bends and geometries with tight tolerances.

BRIEF DESCRIPTION OF THE DRAWINGS

Embodiments are described by way of example, with reference to the accompanying drawings, which are not drawn to scale.

DETAILED DESCRIPTION

Reference below will be made to the drawings wherein like structures may be provided with like reference designations. In order to show the structures of various embodiments most clearly, the drawings included herein include diagrammatic representations of various structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Figure 1:
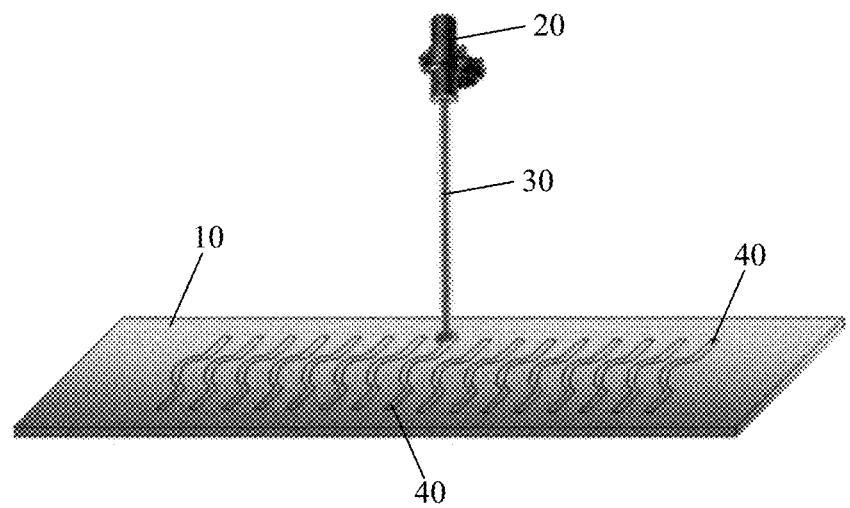
FIG. 1 illustrates a view of a laser cutting a bulk sheet in a predetermined pattern to form test probes, in accordance with certain embodiments.

Certain embodiments relate to the formation of test probes using a laser to cut through a bulk sheet of material. The material may be any material, including, but not limited to, an element, alloy, and/or composite. A single laser can be used to cut through a composite material profile with the same ease as a monolithic bulk sheet. Any suitable laser cutting system may be used. FIG. 1 illustrates a bulk sheet of material 10 that is being cut with a laser 20 that transmits beam 30 along a predetermined profile 40 that defines a plurality of test probes. The laser 20 may be used to cut a complex probe profile (including, but not limited to, elaborate curves, non-uniform cross-sections, and tight tolerances) from the bulk sheet 10. Suitable laser machines have the ability to follow a complicated shape profile, as well as complex recipe optimizations including, for example, multiple passes of the laser, power shaping, and even double sided processing at micron accuracy.

In accordance with certain embodiments, the laser cut probes may be formed to include flat sidewalls. One conventional method to form test probes includes chemical etching a metal to form the desired probe geometry. One problem with etching processes is that for many materials, the resultant structure includes sidewalls that are neither flat nor perpendicular to the top and bottom surfaces. Such sidewalls may be difficult to properly position within a test card.

Figure 2A:
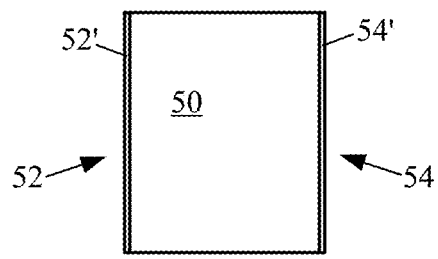
FIG. 2A illustrates a cross-sectional view of a test probe showing flat sidewalls, in accordance with certain embodiments.
Figure 2B:
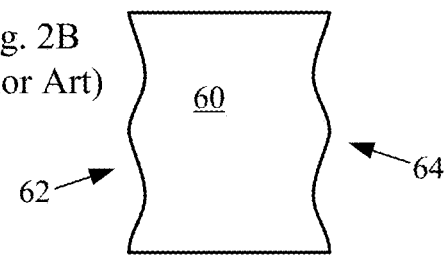
FIG. 2B illustrates a cross-sectional view of a prior art test probe showing curved sidewalls formed during a chemical etching process.

FIG. 2A illustrates a cross-sectional view of a test probe 50 including flat sidewall surfaces 52, 54 that are cut by the laser, in accordance with certain embodiments. FIG. 2B illustrates a cross-sectional view of a prior art test probe 60 having etched sidewall surfaces 62, 64 that have concave regions thereon. Such non-flat surfaces may be more difficult or impossible to fit into a test card without additional processing operations (such as machining or sanding) that add cost and complexity to the fabrication process. Accordingly, a more flat sidewall surface such as that formed using a laser and illustrated in FIG. 2A leads to a better fit in a test card and can be efficiently manufactured.

It has also been found that the use of laser cut surfaces for forming test probes yields less of a variance in dimensions from probe to probe when compared with chemically etched surfaces. In addition, it has been found that finer manufacturing tolerances may be achieved using a laser to cut the surface when compared with chemically etching the surface. In certain embodiments, if desired, any sharp edges formed on the test probes obtained using laser processing may be chamfered or smoothed using a brief mechanical deburring operation or a brief chemical etch operation. In such embodiments, the flat sidewall surfaces may include edges at the interface with other surfaces that have been slightly smoothed.

It has been observed that the application of the laser to the surface of the bulk sheet material to form the probe can act to modify the microstructure of the probe material within a small heat affected zone on the cut surfaces, especially with lower energy longer pulse width lasers. For example, as illustrated in FIG. 2A, a heat affected zone 52' and 54' may extend a very small distance into the laser cut sidewall surfaces 52 and 54. This microstructural change can occur due to the quick melting and solidification of the material when the laser contacts and then moves off of a particular location. The microstructure of the material may have a different structure than that in regions away from the heat affected zone. If desired, in certain embodiments, at least some of the bulk sheet may be formed with a sacrificial layer that can eliminate or minimize the size of at least part of the heat affected zone.

Figure 3:
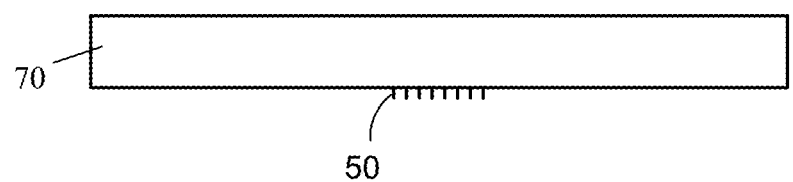
FIG. 3 illustrates a view of a test probe card on which a plurality of laser cut test probes are positioned, in accordance with certain embodiments.

FIG. 3 illustrates a test card 70 including a plurality of test probes 50 positioned therein. The test card 70 may include a number of subcomponents not specifically illustrated in FIG. 3, including, but not limited to, top and bottom guide plates positioned near a top and bottom of the test probes 50 and through which the test probes 50 are positioned.

Figure 4:
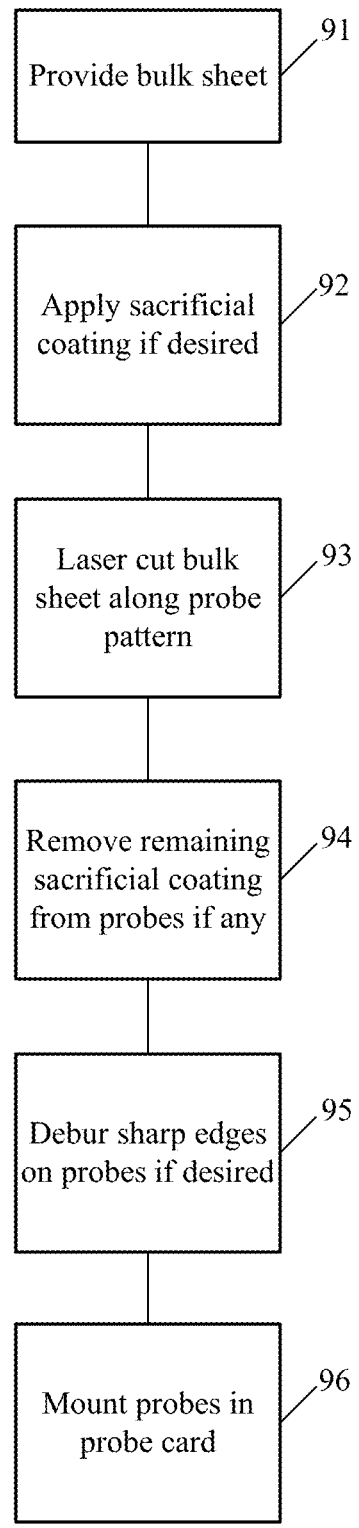
FIG. 4 illustrates a flowchart of operations including laser cutting to form test probes, in accordance with certain embodiments.

FIG. 4 illustrates a flowchart including processing operations for forming laser cut test probes and positioning the probes in a test card, in accordance with certain embodiments. Box 91 is providing a bulk sheet of an electrically conductive material (for example, a metal such as tungsten) that will be cut into individual test probes. Box 92 is applying a sacrificial coating to the bulk sheet if desired, in order to minimize the size of the heat affected zone. Box 93 is laser cutting the bulk sheet to form test probes by directing a laser beam from a suitable laser to the surface of the bulk sheet following a predetermined pattern that corresponds to a test probe. The laser cuts through all or some of the bulk sheet, depending on factors such as, for example, the bulk sheet material, the thickness of the bulk sheet, and the laser power. In certain embodiments, the laser may make more than one pass over the pattern to cut through the entire thickness of the bulk sheet. Depending on the size of the bulk sheet, thousands of probes may be cut from a single bulk sheet. Such mass processing minimizes both processing time and cost.

Box 94 is removing remaining sacrificial coating from the probes if any exists. Box 95 is deburring any sharp edges of the test probe if desired. Box 96 is mounting the test probes in a suitable test card. In certain embodiments, the test card may include upper and lower guide plates into which the probes are positioned. Once mounted in the test card, the probes may be used to conduct testing. It should be appreciated that certain embodiments may include only some of the elements shown in the process flowchart of FIG. 4.

In certain embodiments, the laser may be used to cut test probes from materials that have previously proven difficult to fabricate in an accurate, efficient manner. A variety of materials may be processed into test probes using laser processing as described herein, including, but not limited to, tungsten, alloys of tungsten (for example, NiW), NiMn, CrMo, BeCu, and composite structures including metals and other materials.

Terms such as "first", "second", and the like may be used herein and do not necessarily denote any particular order, quantity, or importance, but are used to distinguish one element from another. Terms such as "top", "bottom", "upper", "lower", and the like may be used for descriptive purposes only and are not to be construed as limiting. Embodiments may be manufactured, used, and contained in a variety of positions and orientations. The term metal as used herein includes pure metals and alloys.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A test probe comprising:
a single electrically conductive material, the test probe including a plurality of laser cut surfaces, wherein the single electrically conductive material includes a heat affected zone extending a distance inward from the laser cut surfaces, the heat affected zone comprising a region that was heated to a temperature of at least a melting point of the single electrically conductive material, the heat affected zone having a microstructure that is different than a microstructure outside of the heat affected zone.

2. The test probe of claim 1, wherein the single electrically conductive material comprises tungsten.

3. The test probe of claim 1, wherein the single electrically conductive material comprises a material selected from the group consisting of NiW, NiMn, CrMo, and BeCu.

4. The test probe of claim 1, wherein the test probe includes a plurality of flat sidewalls.

5. The test probe of claim 1, wherein the test probe includes a curved section.

6. A test probe card comprising:
a plurality of test probes;
a structure adapted to hold the plurality of test probes therein;
the plurality of test probes positioned in the structure, the test probes each formed of a single electrically conductive material, the test probes each including a plurality of laser cut surfaces;
the test probes each including a heat affected zone extending a distance inward from the laser cut surfaces, the heat affected zone comprising a region that was heated to a temperature of at least a melting point of the single electrically conductive material, the heat affected zone having a microstructure that is different than a microstructure outside of the heat affected zone.

7. The test probe card of claim 6, wherein the single electrically conductive material comprises tungsten.

8. The test probe card of claim 6, wherein the single electrically conductive material comprises a material selected from the group consisting of NiW, NiMn, CrMo, and BeCu.

9. The test probe card of claim 6, wherein the test probe each include a plurality of flat sidewalls.

10. The test probe card of claim 6, wherein the test probe each include a curved section.

* * * * *